United States Patent
Wang et al.

(10) Patent No.: US 12,075,601 B2
(45) Date of Patent: Aug. 27, 2024

(54) HEAT DISSIPATION STRUCTURE FOR INVERTER GROUND SCREWS OF A BELT STARTER GENERATOR

(71) Applicant: Vitesco Technologies USA, LLC, Auburn Hills, MI (US)

(72) Inventors: Guoqing Wang, Rochester Hills, MI (US); Laura Noel Church, Mancelona, MI (US)

(73) Assignee: VITESCO TECHNOLOGIES USA, LLC, Auburn Hills, MI (US)

( * ) Notice: Subject to any disclaimer, the term of this patent is extended or adjusted under 35 U.S.C. 154(b) by 181 days.

(21) Appl. No.: 17/805,304

(22) Filed: Jun. 3, 2022

(65) Prior Publication Data
US 2023/0397381 A1 Dec. 7, 2023

(51) Int. Cl.
*H05K 7/20* (2006.01)
*H05K 1/02* (2006.01)

(52) U.S. Cl.
CPC ........... *H05K 7/209* (2013.01); *H05K 1/0201* (2013.01); *H05K 7/20272* (2013.01); *H05K 7/20927* (2013.01)

(58) Field of Classification Search
CPC .. H05K 7/20; H05K 7/20272; H05K 7/20318; H05K 7/20327; H05K 7/2081; H05K 7/20872; H05K 7/209; H05K 7/20927; H05K 7/20936; H05K 1/0201–0204; H05K 1/0272; H05K 2201/064; H02K 5/15; H02K 5/20; H02K 5/207; H02K 9/19; H02K 9/197; H02K 9/227; H01L 23/34; H01L 23/36–367; H01L 23/46; H01L 23/473
See application file for complete search history.

(56) References Cited

U.S. PATENT DOCUMENTS

| | | | | |
|---|---|---|---|---|
| 4,341,432 A | * | 7/1982 | Cutchaw | H01L 23/4006 174/16.3 |
| 5,001,601 A | * | 3/1991 | Fuoco | H01L 23/473 257/E23.098 |
| 5,046,552 A | * | 9/1991 | Tousignant | F28F 3/048 257/E23.098 |

(Continued)

FOREIGN PATENT DOCUMENTS

DE 10039770 A1 * 2/2002 ......... H01L 23/4006

OTHER PUBLICATIONS

DE-10039770-A1 English Translation (Year: 2002).*

*Primary Examiner* — Amir A Jalali

(57) ABSTRACT

A heat dissipation structure for a belt starter generator (BSG) which reduces the temperature of one or more ground screws used to connect a printed circuit board (PCB) to a cooling device of the BSG. The PCB is part of an inverter, and the inverter of the BSG is grounded using two ground screws that fix the PCB to the cooling device. A heat dissipation bridge is connected to the two ground screws, the PCB, and the cooling device. The heat dissipation bridge is connected to the grounds screws such that the heat dissipation bridge is located and in contact with an area of the cooling device where the coolant is flowing through a flow cavity. The heat dissipation bridge absorbs the colder temperature from the cooling device therefore lowers the temperatures of the ground screws to a safe level for the components of the PCB.

6 Claims, 4 Drawing Sheets

(56) References Cited

U.S. PATENT DOCUMENTS

| | | | |
|---|---|---|---|
| 6,198,183 B1* | 3/2001 | Baeumel | H02K 5/225 |
| | | | 310/52 |
| 7,525,224 B2 | 4/2009 | Takenaka et al. | |
| 10,314,210 B2 | 6/2019 | Taguchi | |
| 10,900,412 B2* | 1/2021 | Carter | F02B 39/10 |
| 2001/0014029 A1* | 8/2001 | Suzuki | H05K 7/20927 |
| | | | 363/141 |
| 2005/0253465 A1* | 11/2005 | Takenaka | H02K 5/18 |
| | | | 310/52 |
| 2010/0296247 A1 | 11/2010 | Chang et al. | |
| 2013/0154084 A1* | 6/2013 | Kadoguchi | H01L 24/36 |
| | | | 257/717 |
| 2013/0277820 A1* | 10/2013 | Hotta | H01L 23/473 |
| | | | 257/712 |
| 2018/0228048 A1* | 8/2018 | Blösch | H05K 5/0217 |
| 2021/0153394 A1* | 5/2021 | Mitic | H05K 1/181 |
| 2021/0259142 A1 | 8/2021 | Schmitt et al. | |
| 2022/0130584 A1* | 4/2022 | Tsuchida | H01F 27/02 |
| 2022/0345049 A1* | 10/2022 | Iida | H02M 7/48 |

\* cited by examiner

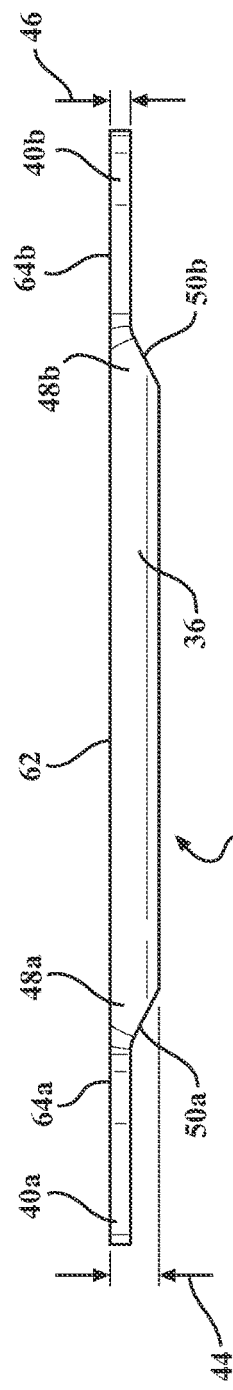
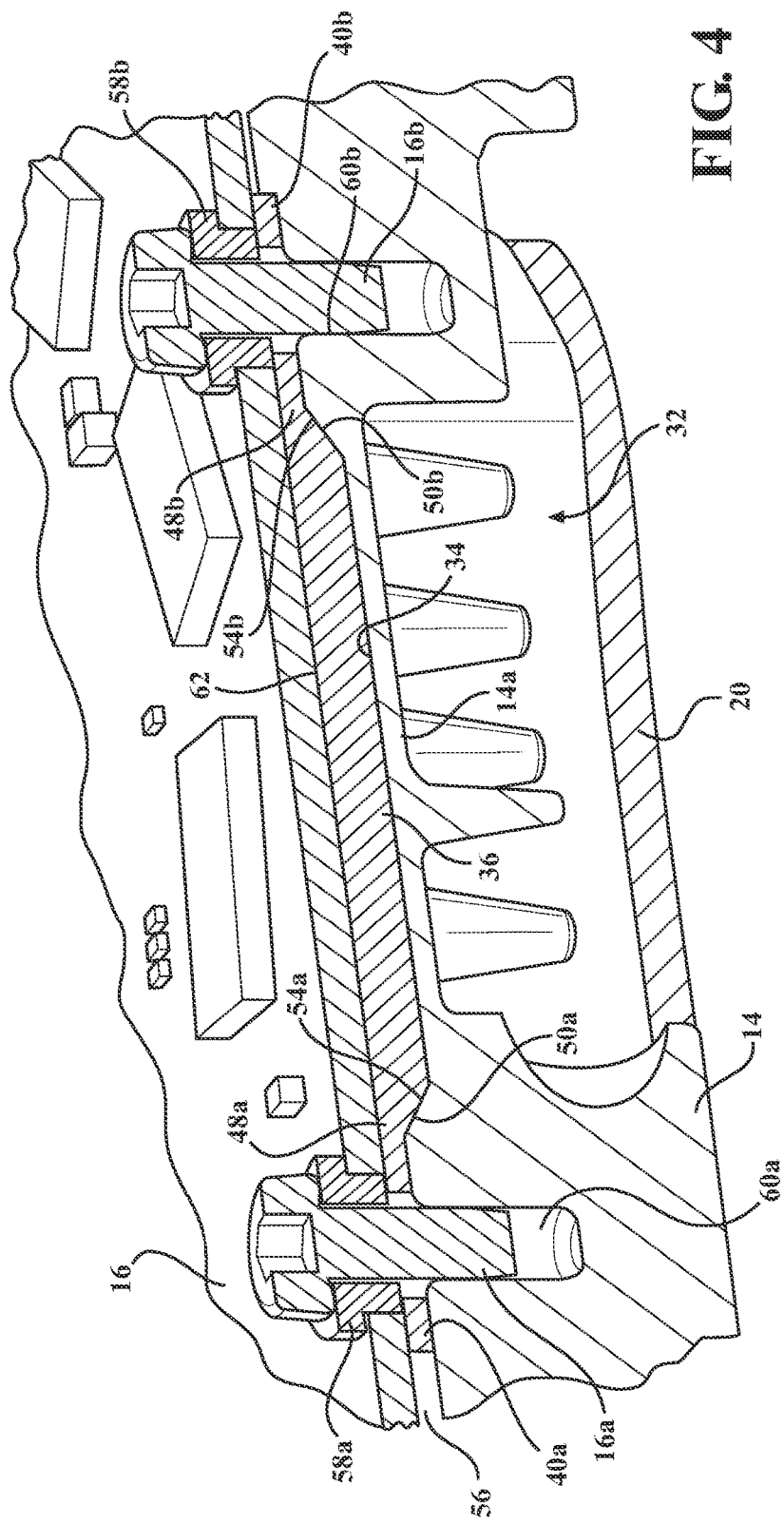

HEAT DISSIPATION STRUCTURE FOR INVERTER GROUND SCREWS OF A BELT STARTER GENERATOR

FIELD OF THE INVENTION

The invention relates generally to a heat dissipation structure for an electrical machine, such as a belt starter generator.

BACKGROUND OF THE INVENTION

One of the components in an engine compartment is an electric machine, such as a belt starter generator (BSG). A BSG is commonly used in modern vehicles and performs a variety of functions. Like many electrical components, the BSG generates heat, and BSGs often incorporate some type of cooling system to control the temperature of the BSG. The cooling system may include a cooling device, such as a heat sink, and possibly some type of fluid circulated through the heat sink. One of the components which has a high level of heat concentration is the ground screw, or screws, which connect the printed circuit board (PCB) to one or more components of the BSG. The high heat concentration is usually created by high electrical current through the ground connection and electrical resistance at surfaces which are near or in contact with the ground screws. There is a risk of damage to the components of the BSG as a result of the heat concentration at the ground screws.

Current designs for cooling the BSG have limitations with regard to the thermal management and temperature concentrations located at the ground screws. Some existing designs facilitate cooling of the inverter system, but none include a reduction in temperature concentrations at the grounding screws.

Accordingly, there exists a need for an improved thermal management of a BSG, more specifically the ground screws which connect the PCB to the components of the BSG.

SUMMARY OF THE INVENTION

The present invention is a heat dissipation structure for a belt starter generator (BSG) which reduces the temperature of one or more ground screws used to connect a printed circuit board (PCB) to a cooling device of the BSG. The PCB is part of an inverter, and the inverter of the BSG is grounded using two ground screws that fix the PCB to the cooling device. A heat dissipation bridge is connected to the two ground screws, the PCB, and the cooling device. The heat dissipation bridge is connected to the grounds screws such that the heat dissipation bridge is located and in contact with an area of the cooling device where the coolant is flowing through a flow cavity. The heat dissipation bridge absorbs the colder temperature from the cooling device therefore lowers the temperatures of the ground screws to a safe level for the components of the PCB.

In an embodiment, the present invention is a heat dissipation structure, including a heat dissipation bridge and a cooling device, the heat dissipation bridge connected to the cooling device, and the cooling device reduces the temperature of the heat dissipation bridge. In an embodiment, the heat dissipation bridge includes a body portion and at least one connecting flange integrally formed with the body portion. The connecting flange is connected to the cooling device.

In an embodiment, the heat dissipation device includes at least one aperture integrally formed as part of the connecting flange, and a fastener is inserted through the aperture and into an aperture of the cooling device, such that when the heat dissipation bridge and the fastener are connected to the cooling device, the cooling device reduces the temperature of the heat dissipation bridge and the fastener.

In an embodiment, a groove is integrally formed as part of the cooling device, and the body portion is at least partially disposed in the groove when the heat dissipation bridge is connected to the cooling device.

In an embodiment, at least one angled portion is formed as part of the body portion and is adjacent the connecting flange, where angled portion has at least one angled surface. At least one angled contact surface is integrally formed as part of the groove, and the angled surface is in contact with the angled contact surface when the heat dissipation bridge is connected to the cooling device.

In an embodiment, a central contact surface is formed as part of the body portion, and an outer contact surface formed as part of the connecting flange. The connecting flange is positioned relative to the body portion such that the outer contact surface formed as part of the connecting flange is aligned with the central contact surface formed as part of the body portion.

In an embodiment, the outer contact surface and the central contact surface are in contact with a printed circuit board when the printed circuit board and the heat dissipation bridge are connected to the cooling device.

In an embodiment, a flow cavity is integrally formed as part of the cooling device such that the flow cavity is adjacent the heat dissipation bridge. Coolant flowing through the flow cavity reduces the temperature of the cooling device and the heat dissipation bridge.

The scope of the invention is not limited to use with a BSG, but may also be used for any type of electric motor or machine.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3C is a side view of a heat dissipation bridge which is used as part of a heat dissipation structure, according to embodiments of the present invention;

FIG. 4 is a sectional view taken along lines 4-4 of FIG. 3A; and

DETAILED DESCRIPTION OF THE PREFERRED EMBODIMENTS

Figure 1:
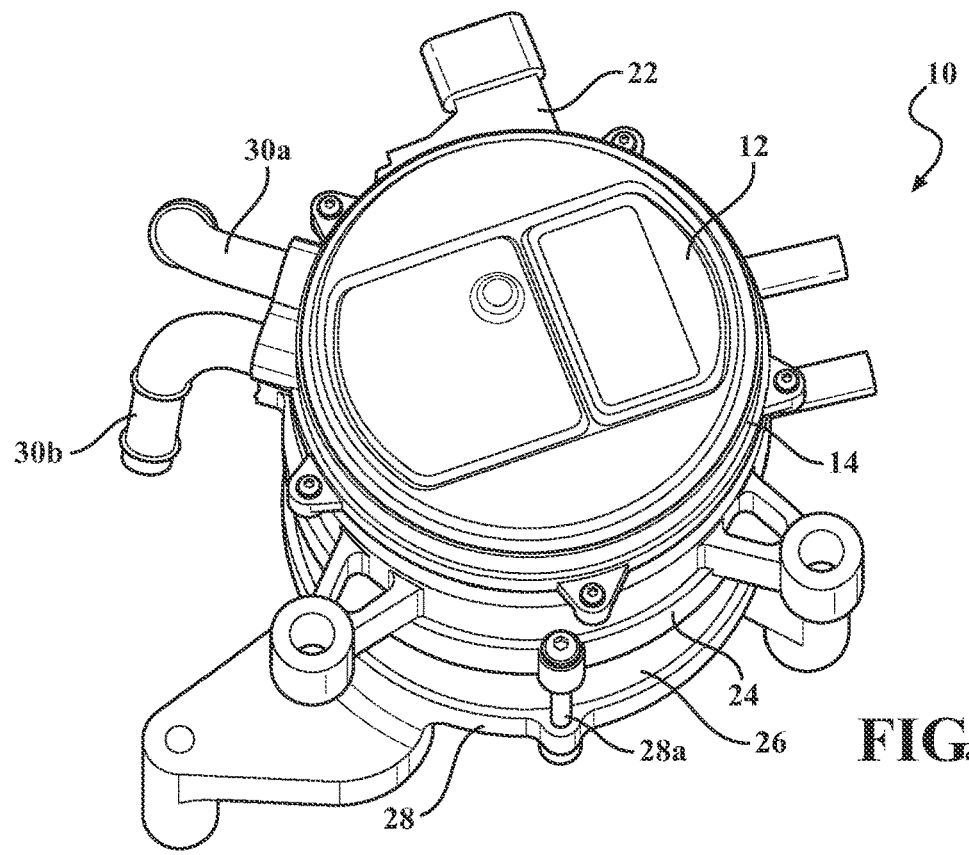
FIG. 1 is a perspective view of a belt starter generator having a heat dissipation structure, according to embodiments of the present invention.
Figure 2:
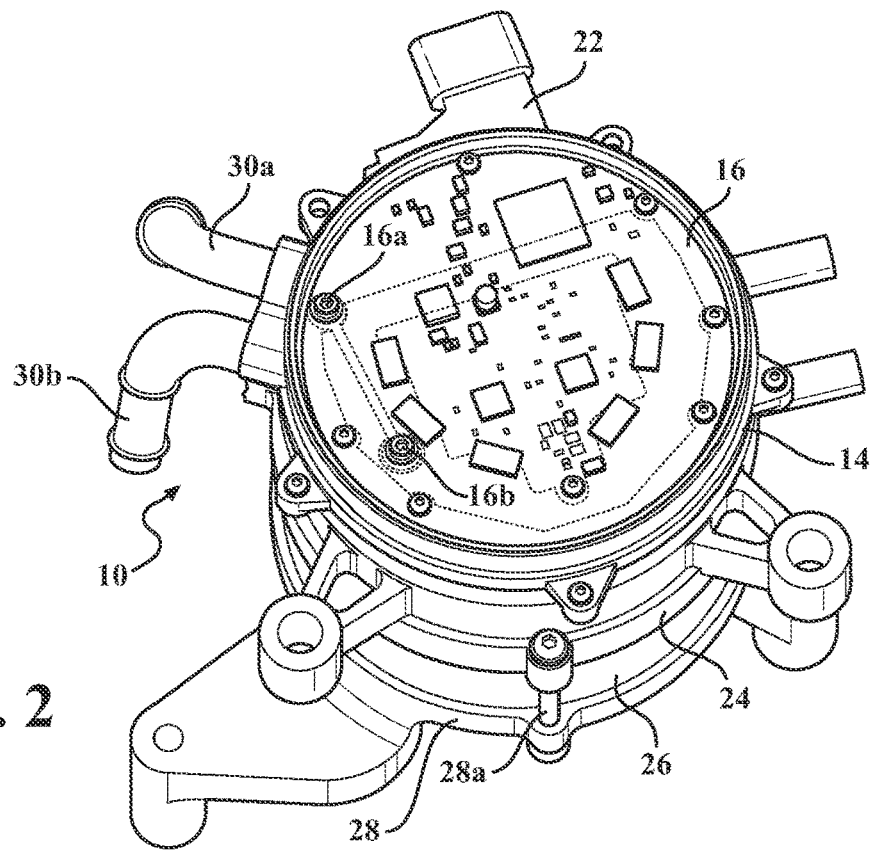
FIG. 2 is a perspective view of a belt starter generator having a heat dissipation structure, with the cover removed, and several components shown in phantom, according to embodiments of the present invention.

The following description of the preferred embodiment(s) is merely exemplary in nature and is in no way intended to limit the invention, its application, or uses.

A belt starter generator (BSG) having a heat dissipation structure is shown in FIGS. 1-3A, generally at 10. The BSG 10 includes a cover 12, and the cover 12 is connected to a cooling device 14, which in this embodiment is a heat sink. Disposed between the cover 12 and the heat sink 14 is a printed circuit board (PCB) 16, and the PCB 16 is connected to the heat sink 14 using several fasteners 16a, 16b. The fasteners 16a, 16b are inserted through apertures of the PCB 16 and into corresponding threaded apertures formed as part of the heat sink 14. There are also fasteners (not shown) which are inserted through apertures of the cover 12 into corresponding threaded apertures formed as part of the heat sink 14, connecting the cover 12 to the heat sink 14.

The PCB 16 includes electrical components which are part of a power inverter used to convert AC current to DC current, and to convert DC current to AC current. When the PCB 16 is assembled to the cover 12 and the heat sink 14, the electrical components are located in a cavity, shown generally at 18, of the heat sink 14. The BSG 10 also includes a cooler cover 20 attached to the heat sink 14, such that the electrical components of the PCB 16 are located between the PCB 16 and the cooler cover 20 in the cavity 18.

The BSG 10 also includes a mainframe 22, connected to the heat sink 14 and a housing portion, which in the embodiment shown is an end shield 24. The end shield 24 partially supports a stator 26, where the stator 26 is partially received into the end shield 24 on the opposite side of the end shield 24 as the mainframe 22. The stator 26 surrounds a rotor (not shown). The stator 26 is also partially disposed in another housing portion, which in the embodiment shown is a motor housing 28. The motor housing 28 is connected to the end shield 24 using elongated fasteners 28a. The elongated fasteners 28a are inserted through apertures formed as part of the end shield 24 and into threaded apertures formed as part of the motor housing 28 to secure the rotor and the stator 26 in the proper location between the end shield 24 and the motor housing 28.

Referring to FIGS. 1 and 4, the heat sink 14 includes an inlet port 30a and an outlet port 30b, and both of the ports 30a, 30b are in fluid communication with a flow cavity, shown generally at 32, where the flow cavity 32 is integrally formed as part of the heat sink 14. During operation, fluid circulates through the flow cavity 32 to provide cooling to the heat sink 14.

Figure 3A:
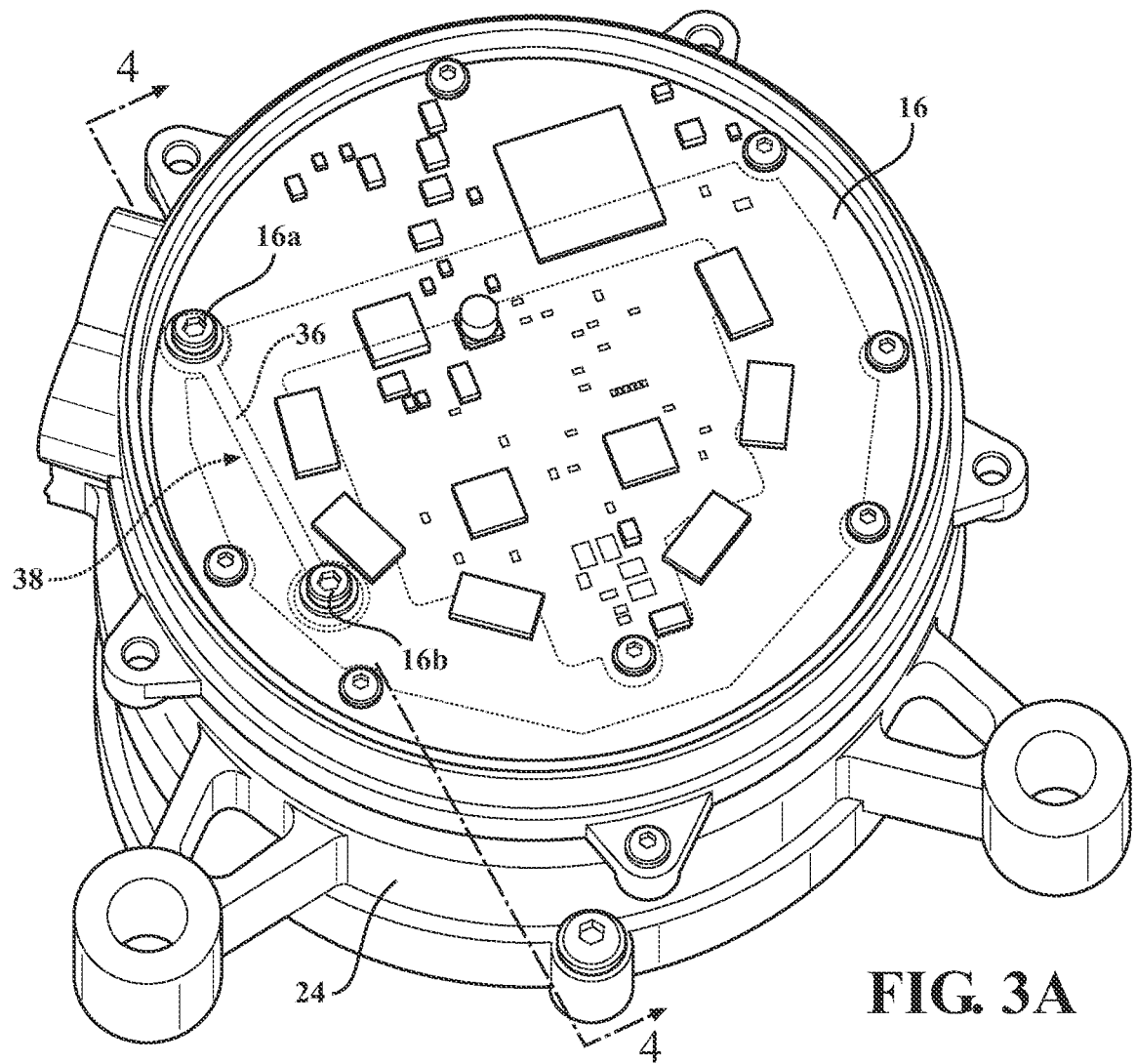
FIG. 3A is an enlarged perspective view of a belt starter generator having a heat dissipation structure, with the cover removed and several components shown in phantom, according to embodiments of the present invention.
Figure 3B:
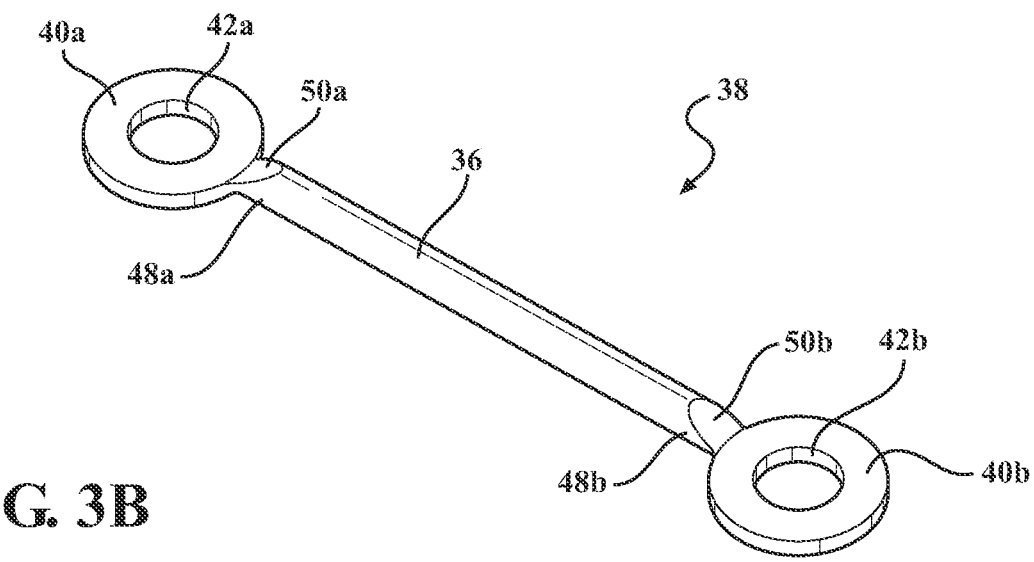
FIG. 3B is a perspective view of a heat dissipation bridge which is used as part of a heat dissipation structure, according to embodiments of the present invention.
Figure 5:
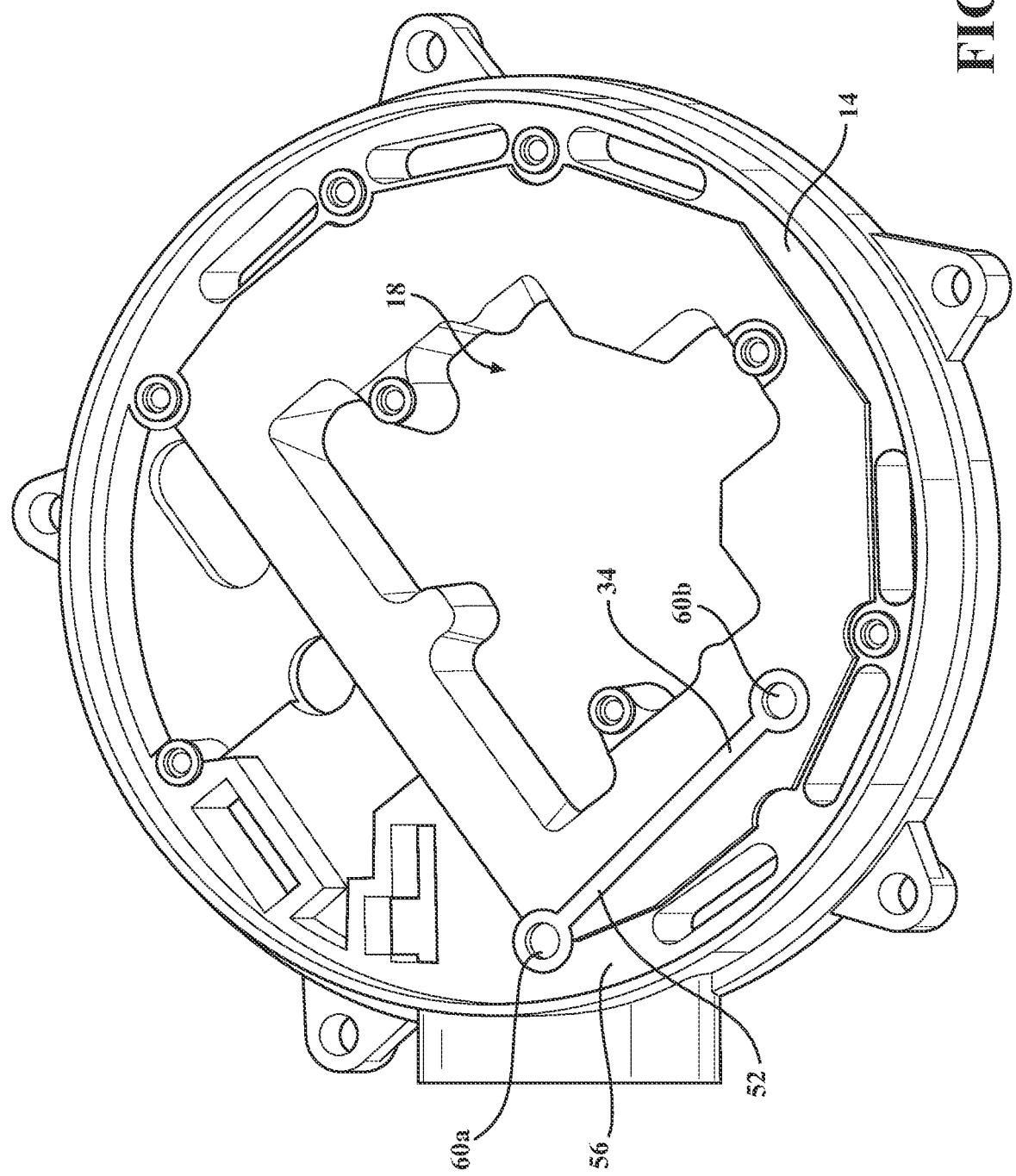
FIG. 5 is a perspective view of a cooling device used as part of a belt starter generator having a heat dissipation structure, according to embodiments of the present invention.

Referring to FIGS. 4-5, integrally formed as part of the heat sink 14 is a groove 34, and the groove 34 is located near the flow cavity 32, such that there is a wall portion 14a between the groove 34 and the flow cavity 32. The groove 34 is shaped to receive the body portion 36 of a heat dissipation bridge, shown generally at 38. Referring to FIGS. 3B-3C, connected to the body portion 36 is a first connecting flange 40a and a second connecting flange Integrally formed as part of the first connecting flange 40a is a first aperture 42a, and integrally formed as part of the second connecting flange 40b is a second aperture 42b. The width 44 of the body portion 36 is greater than the width 46 of the connecting flanges 40a, 40b. The body portion 36 also includes a first angled portion 48a having a first angled surface 50a, and a second angled portion 48b having a second angled surface 50b.

Referring generally to FIGS. 3B-5, the body portion 36 has a curved surface, and the groove 34 includes a contact surface 52 which is contoured such that the contact surface 52 corresponds to the shape of the body portion 36. The groove 34 also includes a first angled contact surface 54a and a second angled contact surface 54b. To connect the heat dissipation bridge 38 to the heat sink 14, the heat dissipation bridge 38 is positioned such that the body portion 36 is disposed in the groove 34 and the body portion 36 is in contact with the contact surface 52, the first angled surface 50a is in contact with the first angled contact surface 54a, and the second angled surface 50b is in contact with the second angled contact surface 54b. The connecting flanges 40a, 40b are also in contact with an outer surface 56 of the heat sink 14. The fasteners 16a, 16b are then inserted through corresponding washers 58a, 58b mounted to the PCB 16, through the apertures 42a, 42b respectively, and into corresponding threaded apertures 60a, 60b formed as part of the heat sink 14.

The heat dissipation bridge 38 also includes a central contact surface 62, which is substantially flat and is formed as part of the body portion 36, and each of the connecting flanges 40a, 40b also includes an outer contact surface 64a, 64b, which is also substantially flat. Each of the connecting flanges 40a, 40b are positioned relative to the body portion 36 such that the outer contact surfaces 64a, 64b of the connecting flanges 40a, 40b are aligned with the central contact surface 62 of the body portion 36, and when assembled, the outer contact surfaces 64a, 64b of the connecting flanges 40a, 40b and the central contact surface 62 of the body portion 36 contact the PCB 16, such that there is no gap between the heat dissipation bridge 38 and the PCB 16.

In an embodiment, the heat dissipation bridge 38 is made of copper, but it is within the scope of the invention that other materials may be used. The heat dissipation bridge 38 may be connected to the heat sink 14 and PCB 16 using the fasteners 16a, 16b, but it is within the scope of the invention that connection between these components may be achieved using other methods, such as welding. Furthermore, the length and thickness of the heat dissipation bridge 38, more specifically the body portion 36, may vary, depending upon the application and the amount of heat which is to be extracted.

Referring to the Figures generally, during operation of the BSG 10, fluid flows from the inlet port 30a into the flow cavity 32, circulates through the flow cavity 32, and flows from the flow cavity 32 through the outlet port 30b, which provides liquid cooling to the heat sink 14. In an embodiment, the liquid circulated through the heat sink 14 is an active refrigerant, but it is within the scope of the invention that other types of liquids could be used. This removal of thermal energy from the heat sink 14 reduces the temperature of the heat sink 14, which also reduces the temperature of the body portion 36 of the heat dissipation bridge 38. The reduction in temperature of the body portion 36 also results in a reduction in temperature of the connecting flanges 40a, 40b and the fasteners 16a, 16b. The reduction in temperature of the fasteners 16a, 16b reduces temperature concentrations around the fasteners 16a, 16b, more particularly the first fastener 16a, which is further away from the flow cavity 32 compared to the second fastener 16b. This reduction in temperature of the first fastener 16a results in more consistent operating temperatures, and a reduced probability of thermal damage to components of the BSG 10.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising: a heat dissipation structure, including: a heat dissipation bridge; and a cooling device, the heat dissipation bridge connected to the cooling device, the cooling device further comprising: a flow cavity, the flow cavity adjacent to and fluidically isolated from the heat dissipation bridge; wherein coolant flowing through the flow cavity of the cooling device reduces the temperature of the heat dissipation bridge, the heat dissipation bridge further comprising: a body portion; and at least one connecting flange integrally formed with the body portion; wherein the at least one connecting flange is connected to the cooling device, a groove integrally formed as part of the cooling device; wherein the body portion is at least partially disposed in the groove when the heat dissipation bridge is connected to the cooling device, at least one angled portion formed as part of the body portion and is adjacent the at least one connecting flange, the at least one angled portion having at least one angled surface; and at least one angled contact surface integrally formed as part of the groove; wherein the at least one angled surface is in direct contact with the at least one angled contact surface when the heat dissipation bridge is connected to the cooling device.

2. The apparatus of claim 1, the heat dissipation bridge further comprising:

at least one aperture integrally formed as part of the at least one connecting flange;

wherein a fastener is inserted through the at least one aperture and into an aperture of the cooling device, such that when the heat dissipation bridge and the fastener are connected to the cooling device, the cooling device reduces the temperature of the heat dissipation bridge and the fastener.

3. The apparatus of claim 1, further comprising:

a central contact surface formed as part of the body portion; and an outer contact surface formed as part of the at least one connecting flange;

wherein the at least one connecting flange is positioned relative to the body portion such that the outer contact surface formed as part of the at least one connecting flange is aligned with the central contact surface formed as part of the body portion.

4. The apparatus of claim 3, wherein the outer contact surface and the central contact surface are in contact with a printed circuit board when the printed circuit board and the heat dissipation bridge are connected to the cooling device.

5. A belt starter generator (BSG) having a heat dissipation structure, comprising: a cooling device; a PCB connected to the cooling device; a flow cavity formed as part of the cooling device; the heat dissipation structure, further comprising: a heat dissipation bridge connected to the cooling device such that the flow cavity is adjacent to and fluidically isolated from the heat dissipation bridge; a groove integrally formed as part of the cooling device adjacent to the flow cavity, a portion of the heat dissipation bridge disposed in the groove; wherein the heat dissipation bridge is connected to the cooling device and the PCB such that the heat dissipation bridge is disposed between the cooling device and the PCB, and the heat dissipation bridge is cooled by fluid flowing in the flow cavity, at least one connecting flange integrally formed with a body portion; and at least one aperture integrally formed as part of the at least one connecting flange; wherein a fastener is inserted through an aperture of the PCB, the at least one aperture, and into an aperture of the cooling device, connecting the at least one connecting flange to the cooling device and the PCB, such that the heat dissipation bridge transfers heat away from the fastener, The BSG further comprising: at least one angled portion formed as part of the body portion and is adjacent the at least one connecting flange, the at least one angled portion having at least one angled surface; and at least one angled contact surface integrally formed as part of the groove; wherein the at least one angled surface is in direct contact with the at least one angled contact surface when the heat dissipation bridge is connected to the cooling device.

6. The BSG having the heat dissipation structure of claim 5, wherein the flow cavity is integrally formed as part of the cooling device such that the flow cavity is adjacent the heat dissipation bridge.

* * * * *